(12) United States Patent
Fujii et al.

(10) Patent No.: US 9,129,808 B2
(45) Date of Patent: Sep. 8, 2015

(54) EPITAXIAL WAFER, PHOTODIODE, OPTICAL SENSOR DEVICE, AND METHODS FOR PRODUCING EPITAXIAL WAFER AND PHOTODIODE

(75) Inventors: Kei Fujii, Itami (JP); Katsushi Akita, Itami (JP); Takashi Ishizuka, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 231 days.

(21) Appl. No.: 13/583,179

(22) PCT Filed: Oct. 3, 2011

(86) PCT No.: PCT/JP2011/072734
§ 371 (c)(1),
(2), (4) Date: Sep. 6, 2012

(87) PCT Pub. No.: WO2012/046676
PCT Pub. Date: Apr. 12, 2012

(65) Prior Publication Data
US 2012/0326122 A1   Dec. 27, 2012

(30) Foreign Application Priority Data

Oct. 6, 2010  (JP) .................................. 2010-226931
Sep. 1, 2011  (JP) .................................. 2011-191082

(51) Int. Cl.
*H01L 21/00* (2006.01)
*H01L 21/20* (2006.01)
(Continued)

(52) U.S. Cl.
CPC ............. *H01L 21/0262* (2013.01); *B82Y 20/00* (2013.01); *C30B 25/183* (2013.01);
(Continued)

(58) Field of Classification Search
USPC .............. 438/94, 479; 257/14, 431, E29.091, 257/E31.019, E31.032, E21.09
See application file for complete search history.

(56) References Cited

U.S. PATENT DOCUMENTS

2007/0264835 A1   11/2007   Iguchi et al.

FOREIGN PATENT DOCUMENTS

EP   2 320 464 A1   5/2011
EP   2 461 374 A1   6/2012
(Continued)

OTHER PUBLICATIONS

Sidhu et al., "A Long-Wavelength Photodiode on InP Using Lattice-Matched GaInAs—GaAsSb Type-II Quantum Wells," IEEE Photonics Technology Letters, vol. 17, No. 12, pp. 2715-2717 (2005).
(Continued)

*Primary Examiner* — Calvin Choi
(74) *Attorney, Agent, or Firm* — Venable LLP; Michael A. Sartori; Tamatane J. Aga

(57) ABSTRACT

Provided are an epitaxial wafer, a photodiode, and the like that include an antimony-containing layer and can be efficiently produced such that protruding surface defects causing a decrease in the yield can be reduced and impurity contamination causing degradation of the performance can be suppressed.
The production method includes a step of growing an antimony (Sb)-containing layer on a substrate 1 by metal-organic vapor phase epitaxy using only metal-organic sources; and a step of growing, on the antimony-containing layer, an antimony-free layer including a window layer 5, wherein, from the growth of the antimony-containing layer to completion of the growth of the window layer, the growth is performed at a growth temperature of 425° C. or more and 525° C. or less.

10 Claims, 9 Drawing Sheets

(51) Int. Cl.

| | | |
|---|---|---|
| *H01L 21/36* | (2006.01) | |
| *H01L 21/02* | (2006.01) | |
| *C30B 25/18* | (2006.01) | |
| *C30B 29/40* | (2006.01) | |
| *H01L 31/0352* | (2006.01) | |
| *H01L 31/105* | (2006.01) | |
| *H01L 31/18* | (2006.01) | |
| *B82Y 20/00* | (2011.01) | |

(52) U.S. Cl.
CPC .......... *C30B29/403* (2013.01); *H01L 21/0254* (2013.01); *H01L 21/02387* (2013.01); *H01L 21/02392* (2013.01); *H01L 21/02458* (2013.01); *H01L 21/02463* (2013.01); *H01L 21/02466* (2013.01); *H01L 21/02507* (2013.01); *H01L 21/02546* (2013.01); *H01L 21/02549* (2013.01); *H01L 31/035236* (2013.01); *H01L 31/105* (2013.01); *H01L 31/1844* (2013.01); *Y02E 10/544* (2013.01)

(56) References Cited

FOREIGN PATENT DOCUMENTS

| | | |
|---|---|---|
| JP | 09-213635 A | 8/1997 |
| JP | 2005-286285 A | 10/2005 |
| JP | 2007-035968 A | 2/2007 |
| JP | 2009-206499 A | 9/2009 |

OTHER PUBLICATIONS

S.P. Watkins et al., "Heavily carbon-doped GaAsSb grown on InP for HBT applications," Journal of Crystal Growth, vol. 221, No. 1-4, Dec. 2000, pp. 59-65.

C.A. Wang, "Progress and continuing challenges in GaSb-based III-V alloys and heterostructures grown by organometallic vapor-phase epitaxy," Journal of Crystal Growth, vol. 272, No. 1-4, Dec. 10, 2004; pp. 664-681.

W.Y. Jiang et al., "Design and characterization of strain-compensated GaInAs/GaAsSb type-II MQW structure with operation wavelength at~3 pm; Proceedings of SPIE vol. 7660," Apr. 23, 2010, pp. 766030-1-766030-8.

Extended European Search Report in Application No. 11830608.3 dated Apr. 10, 2015.

1a

EPITAXIAL WAFER, PHOTODIODE, OPTICAL SENSOR DEVICE, AND METHODS FOR PRODUCING EPITAXIAL WAFER AND PHOTODIODE

TECHNICAL FIELD

The present invention relates to an epitaxial wafer, a photodiode, an optical sensor device, and methods for producing the epitaxial wafer and the photodiode; in particular, to an epitaxial wafer, a photodiode, and an optical sensor device that have a predetermined composition, less surface defects, and high crystallinity, and to methods for producing the epitaxial wafer and the photodiode.

BACKGROUND ART

III-V compound semiconductors including InP substrates have a bandgap energy corresponding to the near-infrared region and hence are studied for developing photodiodes for applications including communications, biomedical examinations, and image capturing at night.

In particular, for example, the absorption spectra of substances relating to living bodies and environments are in the near-infrared long-wavelength region. Accordingly, expansion of the absorption responsivity of the photodiodes to the long-wavelength region has been an important theme.

For example, Non Patent Literature 1 (NPL 1) proposes a photodiode having an absorption layer having an InGaAs/GaAsSb type-II multiple-quantum well structure (MQW) on an InP substrate. This photodiode has a cutoff wavelength of 2.39 μm and has a characteristic responsivity wavelength ranging from 1.7 μm to 2.7 μm. NPL 1 also proposes use of a strain-compensated structure for expanding the cutoff wavelength to a longer wavelength range, for example, 2 μm to 5 μm.

Patent Literature 1 proposes a photodiode in which a type-II (InGaAs/GaAsSb) MQW is formed on an InP substrate and zinc (Zn) serving as a p-type impurity is selectively diffused through a selective diffusion mask pattern so that pixels are formed so as to be separated by selective non-diffusion regions. On the MQW, (InGaAs diffusive-concentration-distribution-adjusting layer/InP window layer) is disposed. In this photodiode, since etching for the formation of mesa structures is not necessary, high crystallinity is maintained and dark current can be suppressed.

CITATION LIST

Patent Literature

PTL 1: Japanese Unexamined Patent Application Publication No. 2009-206499

Non Patent Literature

NPL 1: R. Sidhu, et. al. "A Long-Wavelength Photodiode on InP Using Lattice-Matched GaInAs—GaAsSb Type-II Quantum Wells, IEEE Photonics Technology Letters, Vol. 17, No. 12 (2005), pp. 2715-2717

SUMMARY OF INVENTION

Technical Problem

It has been found that, when such photodiodes are actually produced by growing a type-II (InGaAs/GaAsSb) MQW, a window layer, and the like by metal-organic vapor phase epitaxy using only metal-organic sources (hereafter, referred to as all metal-organic source MOVPE), rough protruding surface defects are generated on the epitaxial wafer and the production yield is considerably decreased. The protruding surface defects appear to be unavoidably generated in photodiodes of this type under certain conditions rather than rarely generated.

Unless such protruding surface defects are reduced, the production yield cannot be made on the practical level and it is difficult to bring the photodiodes into practical use.

In general, efficient production of a certain epitaxial wafer and achievement of reduction of surface defects are advantageous not only for photodiodes of the above-described type but also for various semiconductor elements.

In addition, in semiconductor elements produced from epitaxial wafers, it is important to suppress not only surface defects but also contamination of impurities that affect the performance of the semiconductor elements.

An object of the present invention is to provide an epitaxial wafer, a photodiode, and an optical sensor device that contain an antimony-containing layer and can be efficiently produced such that protruding surface defects causing a considerable decrease in the yield can be reduced and impurity contamination causing degradation of the performance of semiconductor elements can be suppressed; and methods for producing the epitaxial wafer and the photodiode.

Solution to Problem

In a method for producing an epitaxial wafer according to the present invention, an epitaxial wafer including a substrate composed of a III-V compound semiconductor and an epitaxial layer structure that is composed of a III-V compound semiconductor, includes a window layer, and is disposed on the substrate is produced. This production method includes a step of growing an antimony (Sb)-containing layer on the substrate by metal-organic vapor phase epitaxy using only metal-organic sources; and a step of growing, on the antimony-containing layer, an antimony-free layer including the window layer, wherein, from the growth of the antimony-containing layer to completion of the growth of the window layer, the growth is performed at a growth temperature of 425° C. or more and 525° C. or less.

In this method, by making the growth temperature 525° C. or less, an epitaxial wafer having a low density of surface defects, in particular, protruding surface defects having a height of 10 μm or more can be efficiently grown. Thus, a decrease in the production yield due to discarding based on a visual inspection can be suppressed. When the growth temperature exceeds 525° C., the density of protruding surface defects having a height of 10 μm or more cannot be made to be a predetermined level, for example, 1.0 defect cm$^{-2}$ or less; the production yield is considerably decreased and practical applications become impossible.

By making the growth temperature 425° C. or more, metal-organic source gases can be sufficiently decomposed above the wafer so that carbon that is necessarily contained in the source gases and serves as an impurity is reliably discharged and not incorporated into the epitaxial wafer. When carbon is incorporated, carbon serves as a p-type impurity in III-V compound semiconductors. Thus, an unintended layer of the conductivity type is formed and unintended semiconductor devices are formed. By suppressing carbon contamination in the production of semiconductor elements such as photodiodes, performance degradation due to carbon such as excessively high dark current can be suppressed. As a result, a decrease in the yield due to performance degradation can be suppressed. When the growth temperature is less than 425° C., carbon that is necessarily contained in the metal-organic source gases is incorporated into the epitaxial wafer and performance of the semiconductor elements is considerably degraded.

The above-described temperature denotes a substrate surface temperature that is monitored with a pyrometer including an infrared camera and an infrared spectrometer. In the strict sense, this substrate surface temperature is the temperature of the surface of the epitaxial layer formed on the substrate. Although the temperature is referred to as various terms such as substrate temperature, growth temperature, and deposition temperature, all these terms denote the above-described monitored temperature.

Herein, the metal-organic vapor phase epitaxy using only metal-organic sources denotes epitaxy using, as all the sources for vapor phase epitaxy, metal-organic sources composed of metal-organic compounds, and is described as all metal-organic source MOVPE. Although all metal-organic source MOVPE has a large number of advantages as described below, the biggest advantage is that layers can be efficiently grown.

As for the above-described growth temperature of 425° C. or more and 525° C. or less, all the layers may be grown at the same growth temperature or different growth temperatures. In particular, as described herein, growth temperature for the window layer is preferably at least 25° C. lower than growth temperature for a layer ranging from the antimony-containing layer to a layer directly under the window layer.

In this case, while an epitaxial layer structure having high crystallinity is grown, the density of protruding surface defects can be further decreased. Specific explanations are as follows. By growing an epitaxial layer structure at a temperature of 425° C. to 525° C., the dark current can be kept at a low value. In this temperature range, although the dark current is kept at a low level in the case of a growth temperature of 500° C., the dark current gradually increases in the case of a growth temperature of less than 500° C. On the other hand, the lower the growth temperature, the lower the density of protruding surface defects in the window layer becomes.

As a whole, to reduce protruding surface defects in the window layer and to decrease the dark current, as described herein, the window layer only is grown at a growth temperature at least 25° C. lower than growth temperature for the other layer(s). As a result, the density of surface defects can be decreased and the dark current can also be suppressed. Specifically, the window layer is preferably grown at about 450° C. and the other layer(s) is/are preferably grown at about 500° C. Alternatively, other temperature ranges may be employed in accordance with conditions as long as the temperature ranges satisfy the limitations.

The substrate may be any one of an InP substrate, a GaAs substrate, a GaSb substrate, and an InAs substrate.

In this case, in III-V compounds having an Sb-containing layer, problems of protruding surface defects and carbon contamination that are similarly caused irrespective of the type of the substrate can be overcome.

The substrate may be an InP substrate; an InP window layer may be grown as the window layer; and, from initiation of the growth of the antimony-containing layer to completion of the growth of the InP window layer, the growth may be continuously performed in the same growth chamber by the metal-organic vapor phase epitaxy using only metal-organic sources.

In this case, since exposure to the air is not involved, regrown interfaces in which carbon and oxygen are distributed at high concentrations can be eliminated. Accordingly, degradation of the performance of semiconductor elements can be suppressed.

In addition, when the phosphorus-containing InP window layer is formed by all metal-organic source MOVPE, solid phosphorus is not used as the source and hence phosphorus does not adhere to the inner walls of the growth chamber. Accordingly, ignition and the like do not occur at the time of maintenance, which is excellent in terms of safety.

The antimony-containing layer may be a multilayer constituted by one or both of a pair of layers forming a MQW.

Thus, when a MQW has an Sb-containing layer, semiconductor elements having high performance can be produced in high yield. When such an Sb-containing layer is in the MQW, the antimony-free layer including the window layer is positioned on the MQW.

The advantage of producing a MQW by all metal-organic source MOVPE is that the resultant MQW has sharp heterointerfaces between layers. A MQW having sharp heterointerfaces allows, for example, spectrometry with a high accuracy.

In the epitaxial layer structure, a type-II MQW constituted by $In_xGa_{1-x}As$ ($0.38 \leq x \leq 0.68$) and $GaAs_{1-y}Sb_y$ ($0.36 \leq y \leq 1.00$) or a type-II MQW constituted by $Ga_{1-u}In_uN_vAs_{1-v}$ ($0.4 \leq u \leq 0.8$, $0 < v \leq 0.2$) and $GaAs_{1-y}Sb_y$ ($0.36 \leq y \leq 1.00$) may be grown.

Such a type-II MQW has a bandgap energy corresponding to the near-infrared region. According to the above-described method, an epitaxial wafer that has a low density of protruding surface defects and a low carbon concentration and is used for near-infrared light-emitting diodes or photodiodes can be efficiently produced.

The present invention provides a method for producing a photodiode from an epitaxial wafer produced by any one of the above-described production methods, the antimony-containing layer serving as entirety of or a part of an absorption layer, the method including a step of forming a selective diffusion mask pattern on the window layer of the epitaxial wafer; and a step of selectively diffusing an impurity from the window layer exposed through an opening of the selective diffusion mask pattern such that the impurity reaches the absorption layer.

In this case, regions separated by selective non-diffusion regions can be formed as pixels and photodiodes in which cross talk is suppressed can be obtained. In addition, grooves formed by etching for mesa structures are not necessary and hence the dark current can be decreased.

Such a photodiode may include a single pixel or a plurality of pixels that are one-dimensionally or two-dimensionally arranged. This is also the case for photodiodes described below.

An epitaxial wafer according to the present invention includes a substrate composed of a III-V compound semiconductor; and an epitaxial layer structure that is composed of a III-V compound semiconductor, includes a window layer, and is disposed on the substrate. In this epitaxial wafer, the epitaxial layer structure includes an antimony (Sb)-containing layer and, on the antimony-containing layer, an antimony-free layer including the window layer.

The density of protruding surface defects having a height of 10 μm or more in the window layer is 0.05 defects $cm^{-2}$ or more and 1.25 defects $cm^{-2}$ or less, and the antimony-containing layer and the antimony-free layer have a carbon concentration of 5e+15 ($5 \times 10^{15}$) $cm^{-3}$ or less.

In the epitaxial wafer, rough protruding surface defects having a height of 10 μm or more tend to be generated in the surface of a layer overlying the antimony (Sb)-containing layer. These surface defects have a height of 10 μm or more and a planar size of about 30 µm or more and hence cause a considerable decrease in the production yield.

By making the density of the protruding surface defects be 1.25 defects cm$^{-2}$ or less, a decrease in the yield due to the surface defects can be suppressed.

On the other hand, there are cases where epitaxial wafers having a low density of protruding surface defects can be obtained. However, such an epitaxial wafer has a tendency that an Sb-containing layer and an overlying Sb-free layer have a very high carbon concentration. By making the density of the protruding surface defects be 0.05 defects cm$^{-2}$ or more, the carbon concentration in a proper range can be achieved by using, as an index, the density of the protruding surface defects. Specifically, when the density of the protruding surface defects is less than 0.05 defects cm$^{-2}$, the carbon concentration becomes excessively high and photodiodes have a very high dark current.

When the carbon concentration is high, since carbon serves as a p-type impurity in III-V compound semiconductors, unintended semiconductor devices are formed. Accordingly, when such an epitaxial wafer is processed into semiconductor elements such as photodiodes, as to properties, for example, a dark current increases beyond the allowable range. In addition to the adjustment of the density of the protruding surface defects, by making the carbon concentration be 5e+15 ($5 \times 10^{15}$) cm$^{-3}$ or less, degradation of the performance of semiconductor elements can be suppressed.

In the epitaxial wafer, the substrate may be any one of an InP substrate, a GaAs substrate, a GaSb substrate, and an InAs substrate.

In this case, problems of protruding surface defects caused in III-V compounds having an Sb-containing layer can be similarly overcome in these substrates.

A configuration may be employed in which the substrate is an InP substrate; the window layer is an InP window layer; and no regrown interface is present from a bottom surface of the antimony-containing layer to a top surface of the InP window layer.

In this case, high-concentration distributions of carbon and oxygen at the interface caused by carbon and oxygen contamination due to exposure to the air can be suppressed. Thus, degradation of performance of semiconductor elements can be suppressed.

Herein, the regrown interface denotes the interface between a first crystal layer and a second crystal layer when the first crystal layer is grown by a predetermined growth process, the first crystal layer is then taken out in the air, and the second crystal layer is grown on the first crystal layer by another growth process. In general, contamination by oxygen and carbon serving as impurities at high concentrations occurs. When the regrown interface is not formed, an epitaxial layer structure having high crystallinity and a smooth surface can be provided. Thus, photodiodes having low dark current and a high signal-to-noise (S/N) ratio can be obtained.

The antimony-containing layer may be a multilayer constituted by one or both of a pair of layers forming a MQW.

When the Sb-containing layer is in a MQW, semiconductor elements having high performance can be produced in a high yield.

The antimony-containing layer may be a GaAs$_{1-y}$Sb$_y$ multilayer in a type-II MQW constituted by In$_x$Ga$_{1-x}$As ($0.38 \leq x \leq 0.68$) and GaAs$_{1-y}$Sb$_y$ ($0.36 \leq y \leq 1.00$) or a GaAs$_{1-y}$Sb$_y$ multilayer in a type-II MQW constituted by Ga$_{1-u}$In$_u$N$_v$As$_{1-v}$ ($0.4 \leq u \leq 0.8$, $0 < v \leq 0.2$) and GaAs$_{1-y}$Sb$_y$ ($0.36 \leq y \leq 1.00$).

These type-II MQWs have a bandgap energy corresponding to the near-infrared region. Thus, an epitaxial wafer that has a low density of protruding surface defects and a low carbon concentration and is used for near-infrared light-emitting diodes or photodiodes can be obtained.

A photodiode according to the present invention includes any one of the above-described epitaxial wafers, wherein the antimony-containing layer serves as entirety of or a part of an absorption layer, a selective diffusion mask pattern is disposed on the window layer, and an impurity is distributed from the window layer exposed through an opening of the selective diffusion mask pattern such that the impurity reaches the absorption layer.

Thus, photodiodes in which the dark current is low and cross talk is suppressed can be obtained in high production yield, that is, at low production cost.

An optical sensor device according to the present invention includes the above-described photodiode.

Thus, an optical sensor device in which the dark current is low and the responsivity covers the near-infrared long-wavelength region can be provided. Such optical sensor devices encompass complementary metal-oxide semiconductors (CMOSs) having read-out electrodes for pixels of semiconductor elements (photodiodes); optical elements such as spectroscopes (diffraction gratings) and lenses; and control units such as microcomputers.

Advantageous Effects of Invention

According to the present invention, in an epitaxial wafer and the like that contain an antimony-containing layer, protruding surface defects causing a considerable decrease in the yield can be reduced and impurity contamination causing degradation of the performance of semiconductor elements can be suppressed.

REFERENCE SIGNS LIST

1: InP substrate, 1a: wafer (intermediate product), 2: buffer layer (InP and/or InGaAs), 3: type-II MQW absorption layer, 4: InGaAs layer (diffusive-concentration-distribution-adjusting layer), 5: InP window layer, 6: p-type region, 7: epitaxial layers including the absorption layer that are disposed on the buffer layer, 11: p-electrode (pixel electrode), 12: n-electrode, 15: p-n junction, 16: interface between MQW and InGaAs layer, 17: interface between InGaAs layer and InP window layer, 35: antireflection (AR) layer, 36: selective diffusion mask pattern, 50: photodiode (photodiode array), 60: deposition apparatus for all metal-organic source MOVPE, 61: infrared thermometer, 63: reaction chamber, 65: quartz tube, 69: window of reaction chamber, 66: substrate table, 66h: heater, P: pixel

DESCRIPTION OF EMBODIMENTS

First Embodiment

Epitaxial Wafer

Figure 1A:
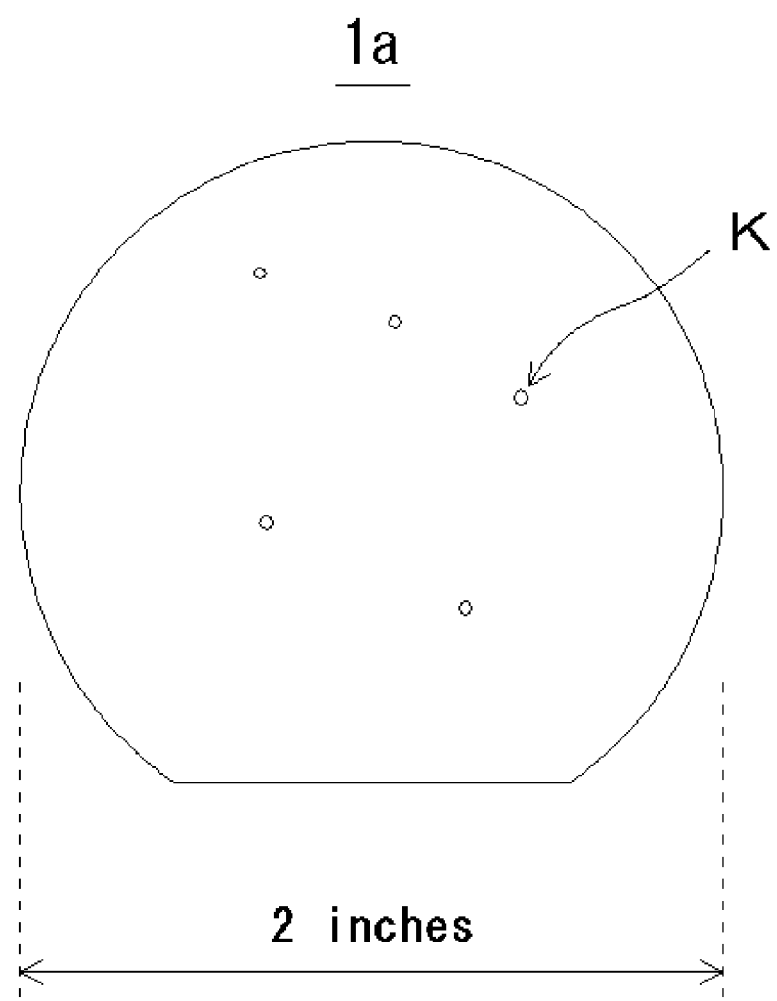
FIG. 1A is a plan view of an epitaxial wafer according to a first embodiment of the present invention.
Figure 1B:
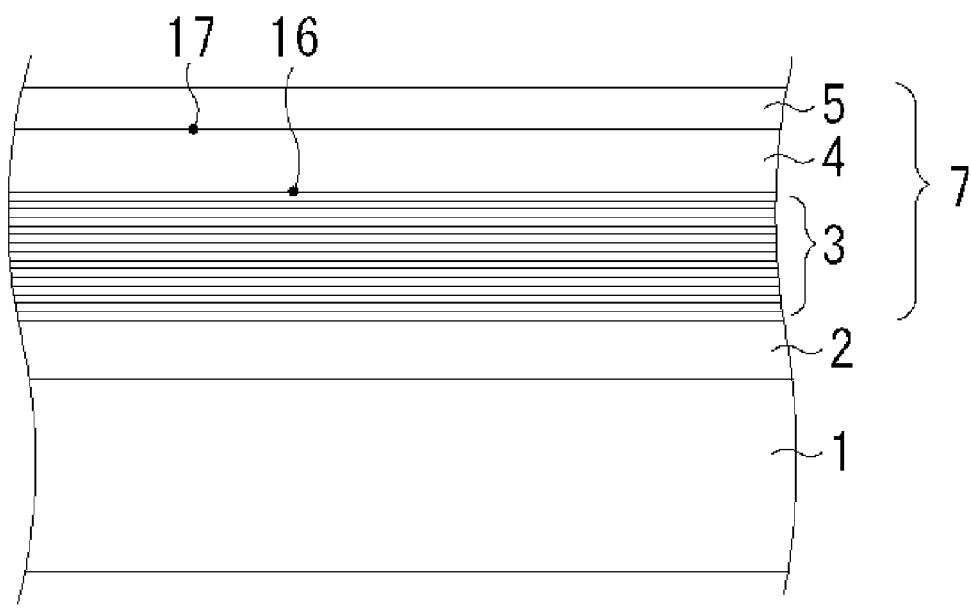
FIG. 1B is a sectional view of an epitaxial wafer according to a first embodiment of the present invention.

FIG. 1A is a plan view of an epitaxial wafer 1a according to an embodiment of the present invention. FIG. 1B is a sectional view of the epitaxial wafer 1a. The epitaxial wafer 1a includes an InP substrate 1, a buffer layer 2, and epitaxial layers 7 disposed on the buffer layer 2. The epitaxial layers 7 are grown by all metal-organic source MOVPE. The structure including the buffer layer 2 is as follows.
(InP Substrate 1/n-Type InP Buffer Layer 2/Absorption Layer 3 Having Type-II (InGaAs/GaAsSb) MQW/InGaAs Diffusive-Concentration-Distribution-Adjusting Layer 4/InP Window Layer 5)

Figure 2:
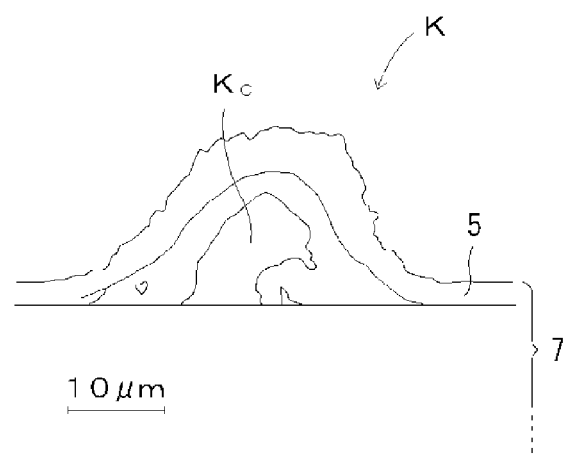
FIG. 2 is a sectional view of a typical protruding surface defect.

In the absorption layer 3, a GaAsSb layer, which is one of a pair of layers forming the MQW, contains Sb. Accordingly, as illustrated in FIG. 1A, protruding surface defects K are formed in the surface of the epitaxial wafer 1a or the surface of the InP window layer 5. FIG. 2 is a sectional view of such a protruding surface defect K. The protruding surface defect K is a raised portion of the InP window layer 5 and has a shape like a protrusion or a mountain (independent peak). The mechanism by which the protruding surface defect K is formed has not been found. Major features of the protruding surface defect K are as follows.
(k1) The height is often 10 μm or more and the planar size is generally 30 μm or more in diameter.
(k2) The core portion of the mountain has a core Kc. In the core Kc, antimony (Sb) is concentrated.

As for the size, since the pixel pitch in a photodiode is about 30 μm, it is clearly understood that the protruding surface defects K cause a considerable decrease in the production yield. The high-concentration Sb in the core Kc is formed through migration from the underlying GaAsSb layer containing Sb and concentration at the core Kc. It has been found that, when a layer overlying the GaAsSb layer is grown at a relatively high temperature, the GaAsSb layer tends to undergo phase separation. The temperature at which GaAsSb undergoes phase separation or some alteration is very low. Experimental results from, for example, Examples indicate that GaAsSb undergoes some undesired alteration even in a range of 425° C. to 525° C. according to the present invention.

In the present embodiment, the density of the protruding surface defects K having a height of 10 μm or more is 1.0 defect cm$^{-2}$ or less. The lower limit of the density of the protruding surface defects K is 0.05 defects cm$^{-2}$.

Another feature of the epitaxial wafer 1a of the present embodiment is a low carbon concentration. Specifically, each of the type-II (InGaAs/GaAsSb) MQW 3, the InGaAs diffusive-concentration-distribution-adjusting layer 4, and the InP window layer 5 has a very low carbon concentration of 5e15 (5×10$^{15}$) cm$^{-3}$ or less. Carbon serves as a p-type impurity in InP-based compound semiconductors. Accordingly, carbon contamination results in the formation of unintended semiconductor elements.

In summary, the epitaxial wafer 1a of the present embodiment has the following two features.
(F1) The density of the protruding surface defects K having a height of 10 μm or more in the surface of the InP window layer 5 is 1.0 defect cm$^{-2}$ or less and 0.05 defects cm$^{-2}$ or more.
(F2) Each of the layers in the epitaxial layers 7 on the InP substrate 1 has a carbon concentration of 5e15 (5×10$^{15}$) cm$^{-3}$ or less.

Although the feature (F2) in terms of carbon concentration is generally achieved, it is an important feature in relation to (F1) in the present invention. As is easily considered, the feature (F2) relates to a method for producing an epitaxial wafer. The epitaxial layers 7 do not include the buffer layer 2 unless otherwise specified. Hereinafter, the production method will be described with reference to FIG. 3.

The InP substrate 1 is first prepared. On the InP substrate 1, the n-type InP buffer layer 2 is epitaxially grown so as to have a thickness of about 150 nm. The n-type doping is preferably performed with tetraethylsilane (TeESi). At this time, source gases used are trimethylindium (TMIn) and tertiarybutylphosphine (TBP). The InP buffer layer 2 may be grown with phosphine (PH$_3$), which is an inorganic material. Even when the InP buffer layer 2 is grown at a growth temperature of about 600° C. or about 600° C. or less, the crystallinity of the underlying InP substrate is not degraded by heating at about 600° C.

The layers overlying the buffer layer 2 are grown by all metal-organic source MOVPE, which can be performed at a low growth temperature and with high growth efficiency. It is evident that the InP buffer layer 2 may be grown by all metal-organic source MOVPE, which is a normal procedure. At least the type-II (InGaAs/GaAsSb) MQW 3, the InGaAs diffusive-concentration-distribution-adjusting layer 4, and the InP window layer 5 are continuously grown in the same growth chamber by all metal-organic source MOVPE. At this time, the growth temperature or the substrate temperature needs to be strictly kept within the temperature range of 425° C. or more and 525° C. or less. This is because, when a growth temperature higher than this temperature range is employed, GaAsSb is thermally damaged to undergo phase separation, resulting in an increase in the density of the protruding surface defects K. Generation of such rough protruding surface defects K at a high density causes a considerable decrease in the production yield.

When a growth temperature less than 425° C. is employed, the density of the protruding surface defects K decreases or becomes zero; however, source gases for all metal-organic source MOVPE are not sufficiently decomposed and carbon is incorporated into the epitaxial layer. The carbon is derived from the hydrocarbons bonded to the metals in the source gases. Incorporation of carbon into an epitaxial layer results in formation of an unintended p-type region and the resultant semiconductor elements have poor performance. For example, such photodiodes have a large dark current and cannot be practically used as products.

Figure 3:
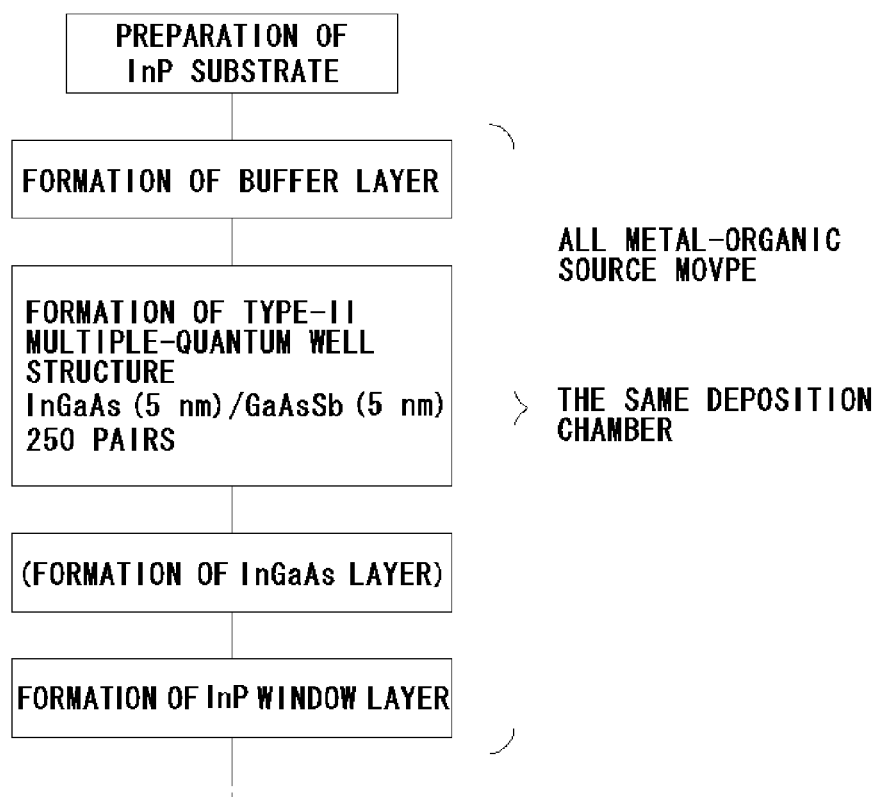
FIG. 3 is a flow chart of a method for producing an epitaxial wafer.

The method for producing an epitaxial wafer has been schematically described so far on the basis of FIG. 3. Hereinafter, growth methods of the layers will be described in detail.

Figure 4:
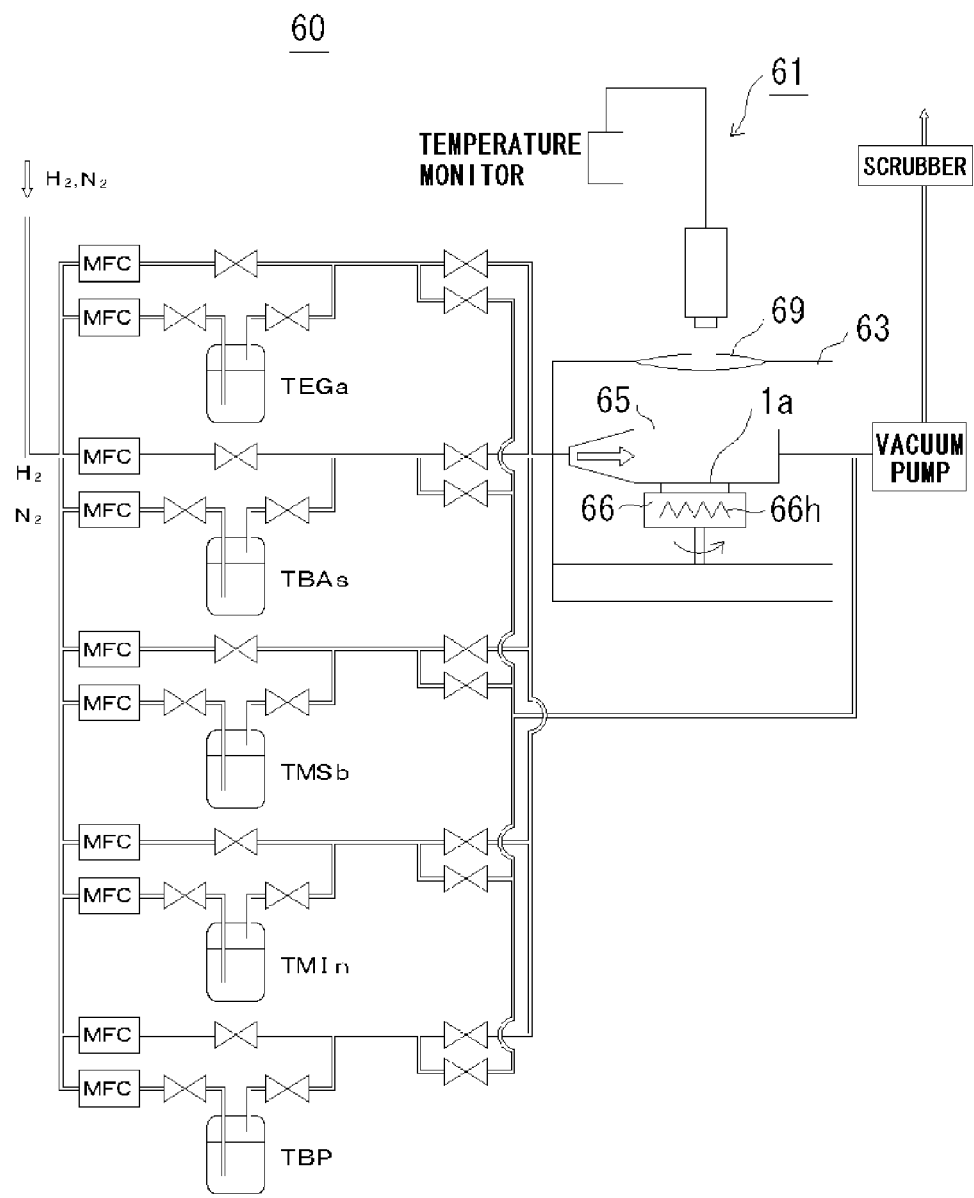
FIG. 4 illustrates the piping system and the like of a deposition apparatus for all metal-organic source MOVPE.

FIG. 4 illustrates the piping system and the like of a deposition apparatus 60 for all metal-organic source MOVPE. A quartz tube 65 is disposed in a reaction chamber (chamber) 63. Source gases are introduced into the quartz tube 65. In the quartz tube 65, a substrate table 66 is rotatably and hermetically disposed. The substrate table 66 is equipped with a heater 66h for heating a substrate. The surface temperature of the epitaxial wafer 1a during deposition is monitored with an infrared thermometer 61 through a window 69 disposed in the ceiling portion of the reaction chamber 63. This monitored temperature is referred to as, for example, the growth temperature, the deposition temperature, or the substrate temperature. Regarding formation of a MQW at a temperature of 425° C. or more and 525° C. or less in a production method according to the present invention, the temperature of 425° C. or more and 525° C. or less is a temperature measured in the temperature monitoring. Forced evacuation of the quartz tube 65 is performed with a vacuum pump.

Source gases are supplied through pipes that are in communication with the quartz tube 65. All metal-organic source MOVPE has a feature of supplying all the source gases in the form of metal-organic gases. That is, in the source gases, metals are bonded to various hydrocarbons. Although FIG. 4 does not describe source gases of, for example, impurities that govern the conductivity type, impurities are also introduced in the form of metal-organic gases. The metal-organic source gases are contained in constant temperature baths and kept at constant temperatures. The carrier gases used are hydrogen ($H_2$) and nitrogen ($N_2$). The metal-organic gases are carried with the carrier gases and sucked with the vacuum pump to thereby be introduced into the quartz tube 65. The flow rates of the carrier gases are accurately controlled with mass-flow controllers (MFCs). A large number of mass-flow controllers, electromagnetic valves, and the like are automatically controlled with microcomputers.

After the buffer layer 2 is grown, the absorption layer 3 having a type-II MQW is formed in which the quantum well is constituted by the pair of InGaAs/GaAsSb. In the quantum well, GaAsSb films have a thickness of, for example, 5 nm; and InGaAs films have a thickness of, for example, 5 nm. In the deposition of GaAsSb, triethylgallium (TEGa), tertiarybutylarsine (TBAs), and trimethylantimony (TMSb) are used. As for InGaAs, TEGa, TMIn, and TBAs can be used. These source gases are all metal-organic gases and the compounds have a high molecular weight. Accordingly, the gases can be completely decomposed at a relatively low temperature of 425° C. or more and 525° C. or less to contribute to crystal growth. The absorption layer 3 having a MQW can be formed by all metal-organic source MOVPE so as to have sharp composition changes at interfaces in the quantum well. As a result, spectrophotometry can be performed with a high accuracy.

The Ga (gallium) source may be TEGa (triethylgallium) or trimethylgallium (TMGa). The In (indium) source may be TMIn (trimethylindium) or triethylindium (TEIn). The As (arsenic) source may be TBAs (tertiarybutylarsine) or triethylarsenic (TMAs).

The Sb (antimony) source may be TMSb (trimethylantimony), triethylantimony (TESb), triisopropylantimony (TIPSb), or trisdimethylaminoantimony (TDMASb).

The source gases are carried through pipes, introduced into the quartz tube 65, and discharged. Any number of source gases may be supplied to the quartz tube 65 by increasing the number of pipes. For example, even more than ten source gases can be controlled by opening/closing of electromagnetic valves.

The flow rates of the source gases are controlled with mass-flow controllers (MFCs) illustrated in FIG. 4 and introduction of the source gases into the quartz tube 65 is turned on/off by opening/closing of electromagnetic valves. The quartz tube 65 is forcibly evacuated with the vacuum pump. The source gases do not stagnate in anywhere and the source gases smoothly automatically flow. Accordingly, switching between compositions during the formation of the pair constituting the quantum well is quickly achieved.

Figure 5A:
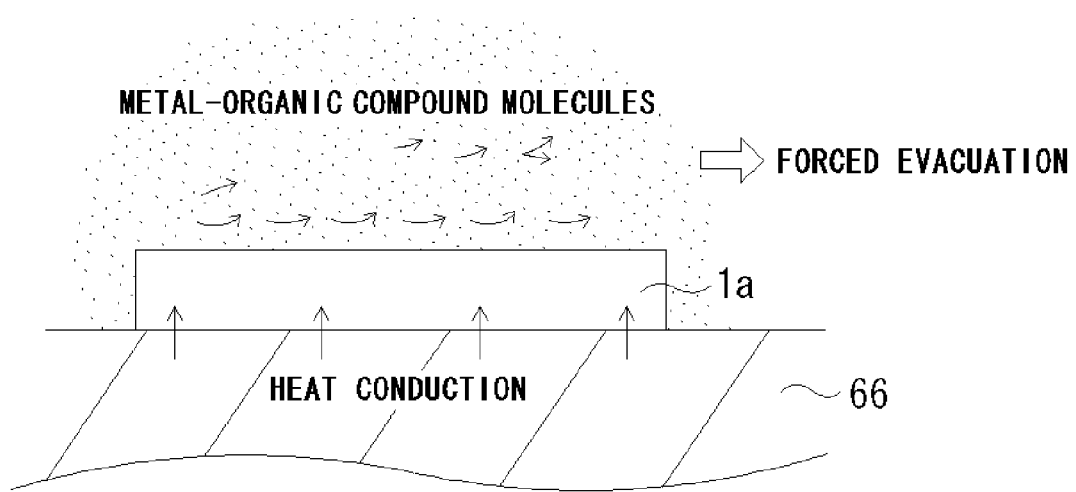
FIG. 5A illustrates flow of metal-organic molecules and thermal flow.
Figure 5B:
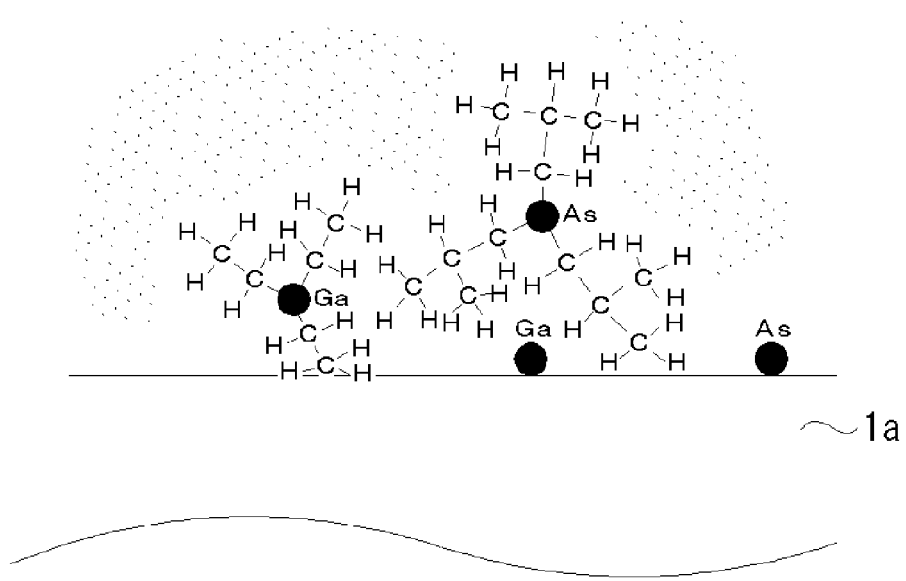
FIG. 5B is a schematic view of metal-organic molecules on a substrate surface.

FIG. 5A illustrates flow of metal-organic molecules and thermal flow. FIG. 5B is a schematic view of metal-organic molecules on a substrate surface. The surface temperature of the epitaxial wafer 1a is monitored. When metal-organic molecules having a large size illustrated in FIG. 5B flow over the wafer surface, compound molecules that decompose to contribute to crystal growth are probably limited to molecules in contact with the surface and molecules present within a thickness range extending for a length of several metal-organic molecules from the surface.

However, when the epitaxial wafer surface temperature or the substrate temperature is excessively low of less than 425° C., large molecules of source gases are not sufficiently decomposed: in particular, carbon is not sufficiently removed and is incorporated into the epitaxial wafer 1a. The carbon incorporated into III-V semiconductors serves as a p-type impurity and unintended semiconductor elements are formed. Thus, the inherent functions of the semiconductors are degraded and the produced semiconductor elements have poor performance.

When source gases are selected with electromagnetic valves so as to correspond to the chemical compositions of the pair and introduced under forcible evacuation with a vacuum pump, after slight growth of a crystal having an old chemical composition due to inertia, a crystal having a new chemical composition can be grown without being influenced by the old source gases. As a result, a sharp composition change can be achieved at the heterointerface. This means that the old source gases do not substantially remain in the quartz tube 65.

When the MQW 3 is formed through growth in a temperature range more than 525° C., the GaAsSb layer of the MQW considerably undergoes phase separation, leading to an increase in the density of the protruding surface defects K. On the other hand, as described above, when a growth temperature less than 425° C. is employed, the density of the protruding surface defects K can be decreased or made zero; however, carbon necessarily contained in source gases is incorporated into the epitaxial wafer. The incorporated carbon functions as a p-type impurity. Accordingly, the resultant semiconductor elements have poor performance and cannot be used as products.

As illustrated in FIG. 3, it is another point that the growth by all metal-organic source MOVPE is continued within the same deposition chamber or the same quartz tube 65 from the formation of the MQW to the formation of the InP window layer 5. Specifically, the epitaxial wafer 1a is not taken out from the deposition chamber prior to the formation of the InP window layer 5 and the InP window layer 5 is not formed by another deposition method; accordingly, regrown interfaces are not formed. Since the InGaAs diffusive-concentration-distribution-adjusting layer 4 and the InP window layer 5 are continuously formed in the quartz tube 65, interfaces 16 and 17 are not regrown interfaces. In regrown interfaces, an oxygen concentration of 1e17 ($1 \times 10^{17}$) cm$^{-3}$ or more or a carbon concentration of 1e17 ($1 \times 10^{17}$) cm$^{-3}$ or more is satisfied; and the crystallinity becomes poor and the surface of the epitaxial layer structure is less likely to become smooth. In the present invention, the interfaces 16 and 17 have an oxygen concentration and a carbon concentration that are less than 1e17 ($1 \times 10^{17}$) cm$^{-3}$.

In the present embodiment, on the absorption layer 3 having a MQW, a non-doped InGaAs diffusive-concentration-distribution-adjusting layer 4 having a thickness of, for example, about 0.3 μm is formed. In the formation of photodiodes, diffusion of Zn at high concentration into the MQW results in degradation of the crystallinity. Accordingly, for the purpose of diffusive-concentration adjustment, the InGaAs diffusive-concentration-distribution-adjusting layer 4 is formed. After the InP window layer 5 is formed, the p-type impurity Zn is selectively diffused by a selective diffusion method from the InP window layer 5 so as to reach the absorption layer 3 having a MQW. Although the InGaAs diffusive-concentration-distribution-adjusting layer 4 may be formed as described above, the formation thereof may be eliminated.

Even when the InGaAs diffusive-concentration-distribution-adjusting layer 4 is inserted and it is a non-doped layer, InGaAs has a narrow bandgap and hence the photodiodes can be made to have a low electric resistance. By decreasing the electric resistance, the responsivity can be enhanced and moving images having high image quality can be obtained.

While the epitaxial wafer 1a is left in the same quartz tube 65, on the InGaAs diffusive-concentration-distribution-adjusting layer 4, it is preferred that the undoped InP window layer 5 be successively epitaxially grown by all metal-organic source MOVPE so as to have a thickness of, for example, about 0.8 µm. As described above, the source gases are trimethylindium (TMIn) and tertiarybutylphosphine (TBP). By using these source gases, the growth temperature for the InP window layer 5 can be made 425° C. or more and 525° C. or less. As a result, GaAsSb of the MQW underlying the InP window layer 5 is subjected to no or relatively small thermal damage. Accordingly, the density of the protruding surface defects K can be decreased to a practically allowable level and the carbon concentration can be decreased.

For example, growth of an InP window layer by molecular beam epitaxy (MBE) requires solid phosphorus source and hence has problems in terms of safety and the like; in addition, the production efficiency needs to be enhanced. In the case where the MQW 3 and the InGaAs diffusive-concentration-distribution-adjusting layer 4 are grown by MBE suitable for the growth of the MQW 3 and the InP window layer 5 is then grown by a method other than MBE in view of safety, the interface 17 between the InGaAs diffusive-concentration-distribution-adjusting layer 4 and the InP window layer 5 is a regrown interface due to exposure to the air. The regrown interface can be identified through secondary ion mass spectrometry because it satisfies an oxygen concentration of 1e17 ($1 \times 10^{17}$) cm$^{-3}$ or more or a carbon concentration of 1e17 ($1 \times 10^{17}$) cm$^{-3}$ or more. The regrown interface forms a cross line through p-type regions; leakage current occurs in the cross line and image quality is considerably degraded.

Alternatively, for example, in the case of growth of an InP window layer by a MOVPE simply employing phosphine (PH$_3$) as the phosphorus source, the decomposition temperature of phosphine is high and hence the probability of thermally damaging the underlying GaAsSb is high.

By performing growth from the type-II (InGaAs/GaAsSb) MQW 3 to the InP window layer 5 by all metal-organic source MOVPE at a growth temperature of 425° C. to 525° C. in the present embodiment, the above-described features (F1) and (F2) can be achieved. In addition, as described above, as a result of the absence of regrown interfaces, epitaxial wafers of high quality containing an antimony-containing layer can be obtained with high efficiency and in practically allowable and high production yield.

Second Embodiment

Photodiode

Figure 6:
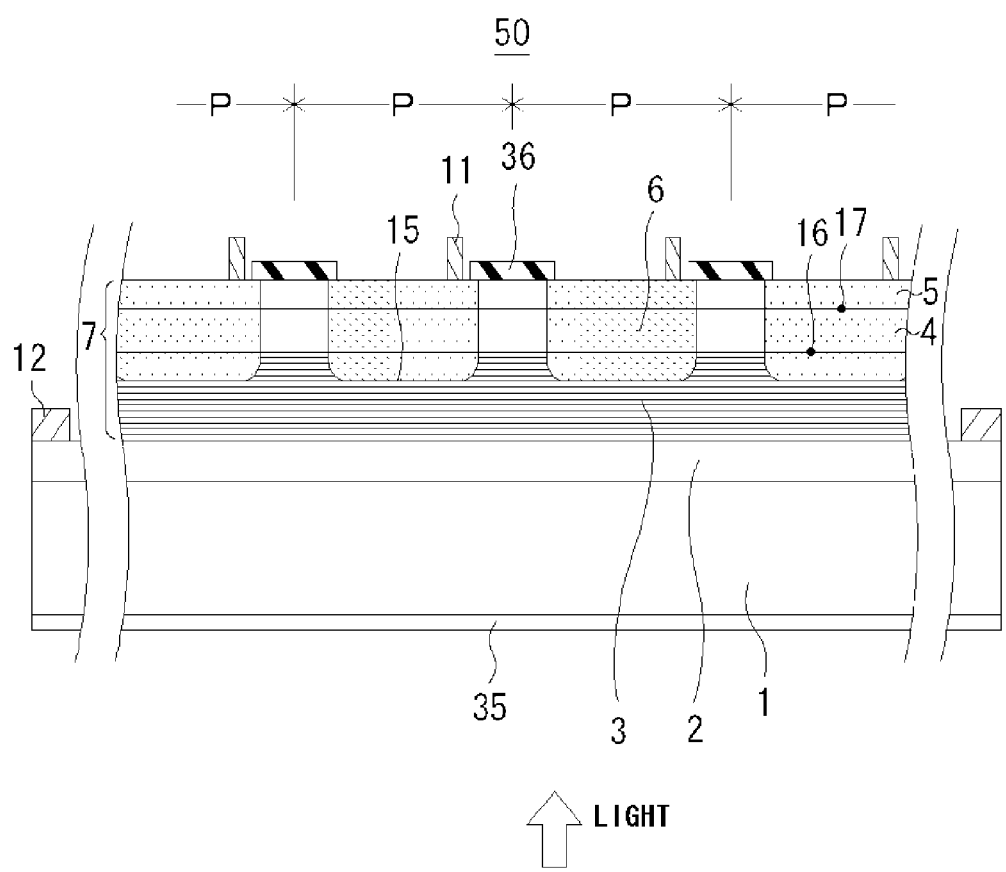
FIG. 6 illustrates a photodiode according to a second embodiment of the present invention.

FIG. 6 illustrates a photodiode 50 according to a second embodiment of the present invention. In the photodiode 50, the configuration of the InP-based epitaxial layer structure on the InP substrate 1 is the same as in the first embodiment.

Figure 7:
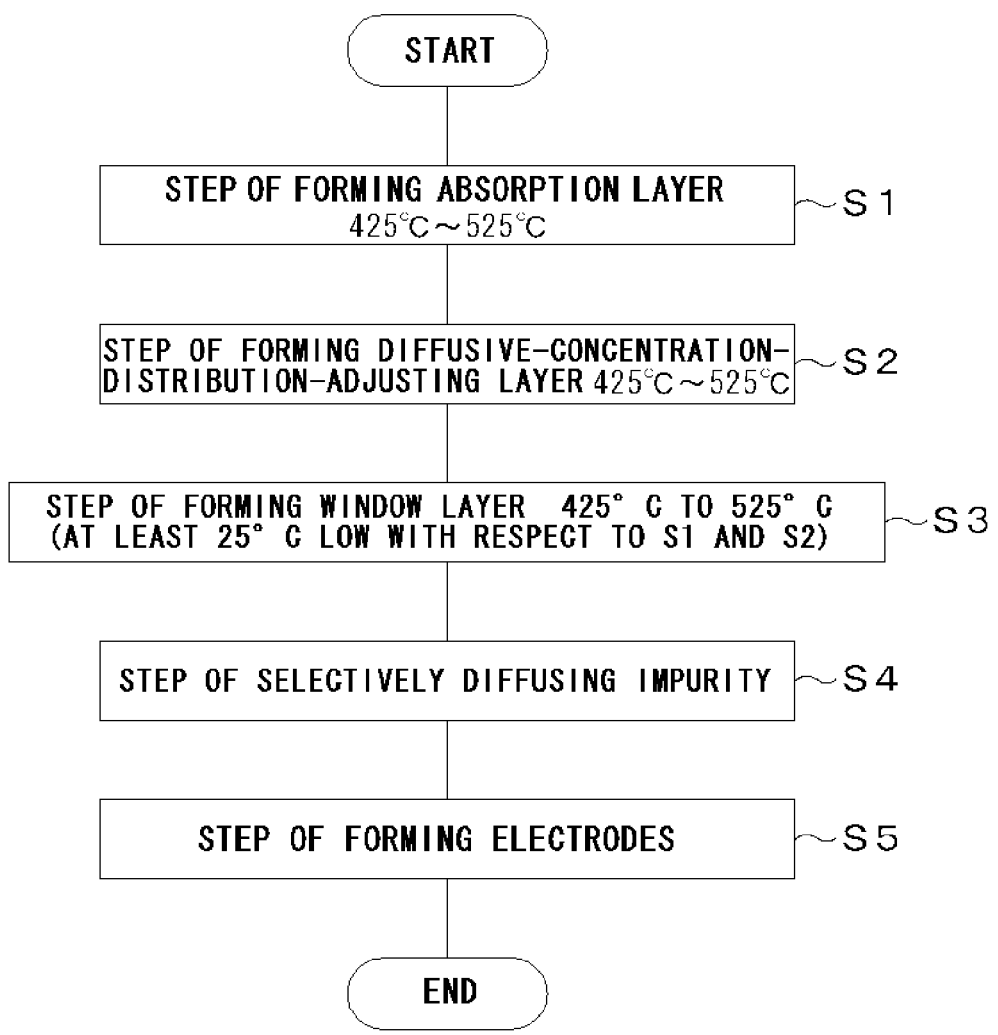
FIG. 7 is a flow chart of a method for producing a photodiode.

The epitaxial wafer in the first embodiment is used to form the photodiode 50 in which pixels P are arranged. Thus, the pixels P and electrodes 11 and 12 are formed. FIG. 7 is a flow chart of a method for producing the photodiode 50 in FIG. 6. Steps S1 to S3 are the same as the method for producing the epitaxial wafer 1a in the first embodiment. In Steps S4 and S5, the pixels P are formed through selective diffusion of Zn and the electrodes are formed.

By selectively diffusing Zn serving as a p-type impurity through openings of a selective diffusion mask pattern 36 of a SiN film, p-type regions 6 extending from the InP window layer 5 through the InGaAs layer 4 to the absorption layer 3 are formed. The p-type regions 6 are separated by selective non-diffusion regions and serve as main parts of the pixels P. By adjusting the pitch of openings of the selective diffusion mask pattern 36, such a p-type region 6 can be formed at a predetermined distance from the neighboring pixel or a side surface.

The p-electrodes 11 composed of AuZn are disposed so as to form ohmic contacts with the p-type regions 6. The n-electrodes 12 composed of AuGeNi are disposed so as to form ohmic contacts with the back surface of the InP substrate 1. The InP substrate 1 is doped with an n-type impurity so as to have a predetermined level of conductivity. Alternatively, the InP substrate 1 may be an insulating or semi-insulating substrate; in this case, n-electrodes 12 are disposed so as to form ohmic contacts with an n-type buffer layer. An antireflection layer 35 is disposed on the back surface of the InP substrate 1. Light enters the InP substrate through the back surface thereof.

Figure 8:
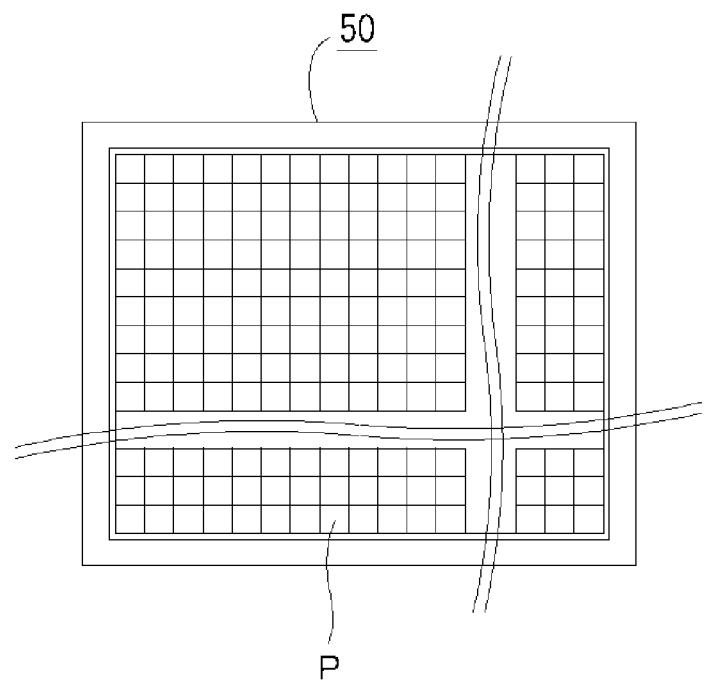
FIG. 8 illustrates an array of pixels in a photodiode (chip).
Figure 9:
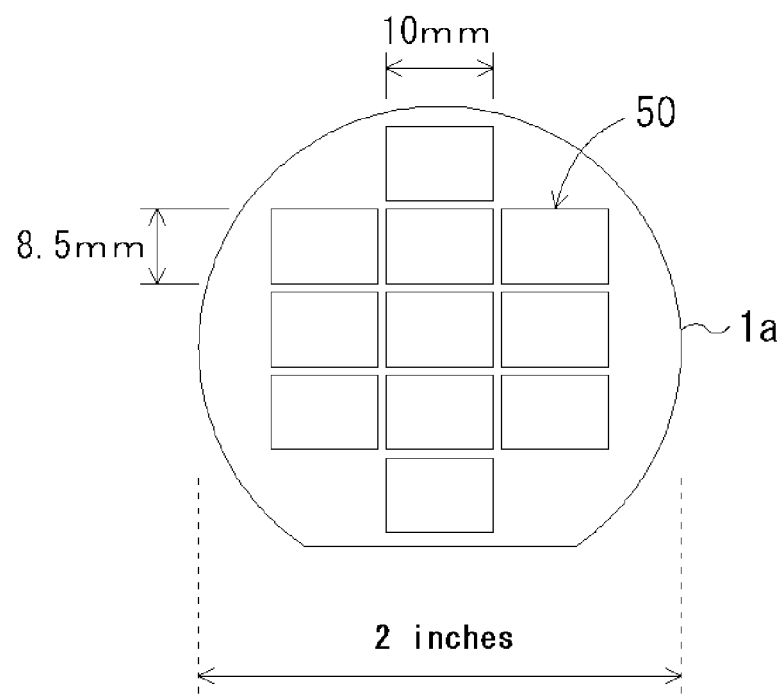
FIG. 9 illustrates, in an epitaxial wafer, the arrangement of chips to be diced into photodiodes (chips).

FIG. 8 is a plan view of a chip (photodiode) 50 obtained by dicing of the epitaxial wafer 1a after the above-described Steps S1 to S5 are completed. The pixels P in FIG. 6 are arranged at a pitch of 30 µm to form a 320×256 matrix. This is also called a photodiode array. The photodiode 50 has dimensions of 10 mm×8.5 mm and is obtained by dicing of the epitaxial wafer 1a in FIG. 9. The Steps S1 to S5 are performed for the entirety of the epitaxial wafer 1a in FIG. 9. Specifically, in view of efficiency, the processing treatments including selective diffusion and electrode formation are performed for the epitaxial wafer 1a. FIG. 9 indicates that eleven photodiodes 50 can be obtained from the epitaxial wafer 1a having a diameter of 2 inches.

In general, the above-described protruding surface defects K have a height of 10 µm or more and a diameter of 30 µm or more. Large defects K have a height of about 100 µm and a diameter of about several hundred micrometers. Since the thickness of the epitaxial wafer 1a is about 350 µm, abnormality of the rough protruding surface defects is understood. The protruding surface defects cause several tens of consecutive defective pixels. These defectives cannot be compensated for with software such as programs and a considerable decrease in the yield is caused. In addition, for example, in the case of using an apparatus having a contact part in the formation of a selective diffusion mask pattern, the epitaxial wafer may be damaged because of the rough protruding surface defects K.

Figure 10:
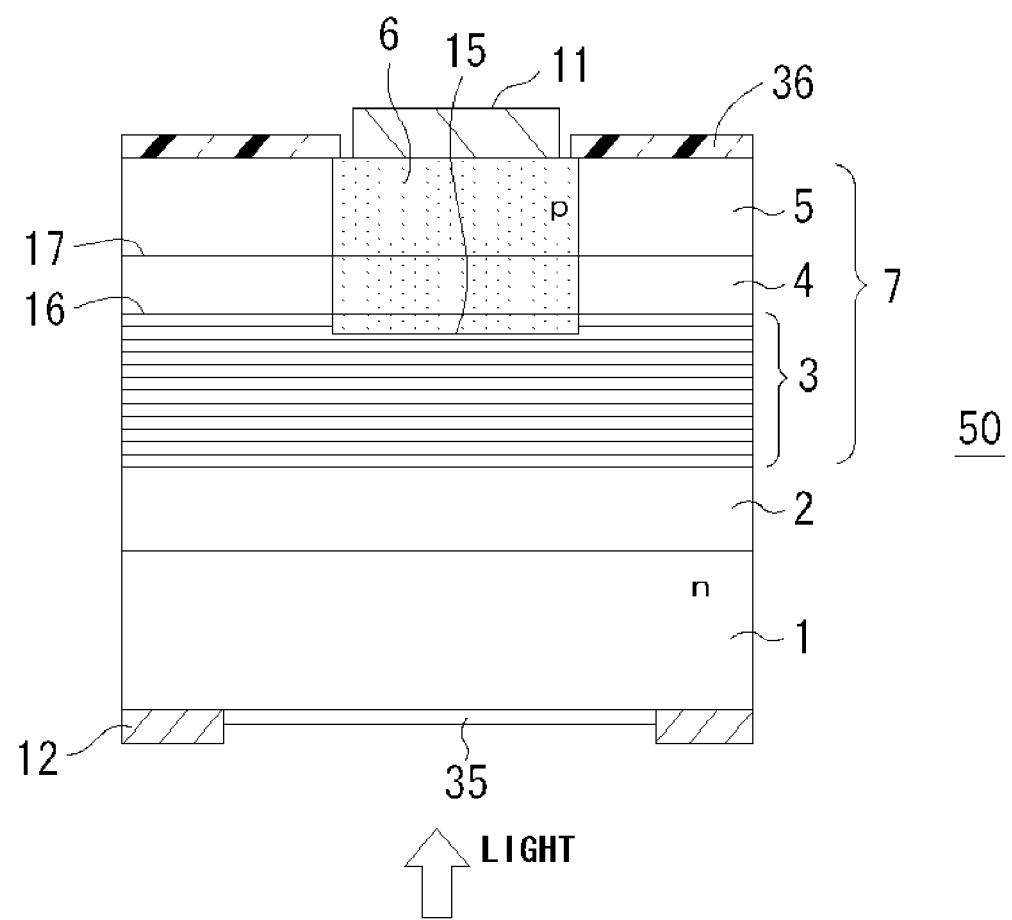
FIG. 10 illustrates a photodiode according to another embodiment of the present invention.

FIG. 10 illustrates a photodiode 50 having a single pixel. Such a photodiode is naturally embraced within the scope of the present invention. In Examples described below, the photodiode 50 in FIG. 10 was used for evaluations in terms of dark current and the like.

By producing the photodiodes 50 from the epitaxial wafer 1a in the first embodiment, the photodiodes 50 containing an antimony-containing layer and having excellent properties such as low dark current can be obtained with high efficiency and in high production yield.

EXAMPLES

Example 1

Constant Growth Temperature Over the Entirety of Epitaxial Layers

The epitaxial wafers 1a having a diameter of 2 inches as illustrated in FIG. 1 were produced under varied production conditions (growth temperatures) and the epitaxial wafers were evaluated. In Example 1, each growth temperature during the growth of the epitaxial layers was made constant. The photodiodes 50 as illustrated in FIG. 10 that were produced from the epitaxial wafers were evaluated in terms of dark current. The test samples were as follows.

(Invention examples A1 to A3) Growth temperatures of type-II MQW and overlying epitaxial layer structure: 450° C., 500° C., 525° C.

(Comparative examples B1, C1, and C2) Growth temperatures of type-II MQW and overlying epitaxial layer structure: 400° C., 550° C., 600° C.

The test samples were subjected to the following evaluations.

(1) density of protruding surface defects having height of 10 μm or more on epitaxial wafer (2) X-ray diffraction method (XRD) evaluation performed after growth of MQW (full width at half maximum of diffraction peak of plane indices (004))

(3) impurity concentration analysis of InGaAs diffusive-concentration-distribution-adjusting layer in epitaxial wafer (SIMS (secondary ion mass spectrometer) analysis)

(4) dark current in photodiode (5) yield of photodiodes with respect to InP substrate The evaluations of the test samples are described in Table I.

TABLE I

|  | Comparative example B1 | Invention example A1 | Invention example A2 | Invention example A3 | Comparative example C1 | Comparative example C2 |
|---|---|---|---|---|---|---|
| Growth temperature for GaAsSb-containing multiple-quantum well and overlying epitaxial layered body | 400° C. | 450° C. | 500° C. | 525° C. | 550° C. | 600° C. |
| Number of protruding surface defects having height of 10·m or more on epitaxial wafer having diameter of 2 inches (density in terms of number is described in parentheses) | 0 defects (0 defects $cm^{-2}$) | 1 defect (0.052 defects $cm^{-2}$) | 10 defects (0.52 defects $cm^{-2}$) | 20 defects (1.0 defect $cm^{-2}$) | 25 defects (1.3 defects $cm^{-2}$) | 90 defects (4.6 defects $cm^{-2}$) |
| XRD evaluation of multiple-quantum well in epitaxial wafer (full width at half maximum of peak) | 55 s | 55 s | 80 s | 85 s | 95 s | 170 s |
| SIMS impurity analysis of InGaAs diffusive-concentration-distribution-adjusting layer in epitaxial wafer | Carbon concentration: 1e+16 $cm^{-3}$ | Carbon concentration: less than lower limit of detection (3e+15 $cm^{-3}$) | Carbon concentration: less than lower limit of detection (3e+15 $cm^{-3}$) | Carbon concentration: less than lower limit of detection (3e+15 $cm^{-3}$) | Carbon concentration: less than lower limit of detection (3e+15 $cm^{-3}$) | Carbon concentration: less than lower limit of detection (3e+15 $cm^{-3}$) |
| Dark current characteristic in produced photodiode | Poor | Good | Excellent | Good | Good | Very poor |
| Yield of produced photodiode arrays | 0% | 72% | 45% | 27% | 0% | 0% |

(1) <Density of Protruding Surface Defects Having Height of 10 μm or More on Epitaxial Wafer>

From Table I, the lower the growth temperature, the lower the density of protruding surface defects becomes. At the growth temperature of 400° C., the density can be made zero. In Invention example A1 in which the growth temperature is 450° C., one protruding surface defect only (density: 0.052 defects $cm^{-2}$) is generated on a wafer having a diameter of 2 inches. In Invention example A2 in which the growth temperature is 50° C. higher than that in Invention example A1, the density sharply increases by a factor of ten with respect to Invention example A1. In Invention example A3 in which the growth temperature is 525° C., the density is 1.0 defect $cm^{-2}$. The protruding-surface-defect density of 1.0 defect $cm^{-2}$ is the upper limit of practically allowable values.

(2) <XRD Evaluation of MQW>

From full width at half maximum of a peak that gives an index for crystalline disorder, in the temperature range having the lowest growth temperature of 400° C., the lower the growth temperature, the smaller the full width at half maximum becomes. This indicates that source gases are sufficiently decomposed even at the very low temperature (400° C.) by all metal-organic source MOVPE. Thus, a feature of all metal-organic source MOVPE has been demonstrated. In Invention examples A1 to A3, the full width at half maximum was 55 to 85 seconds. As the growth temperature increases, the full width at half maximum gradually increases. However, the full width at half maximum does not become excessively broad such as 170 seconds until the growth temperature reaches 600° C. (Comparative example C2).

(3) <Impurity Concentration Analysis of InGaAs Diffusive-Concentration-Distribution-Adjusting Layer>

In Comparative example B1, protruding surface defects are not generated and the crystallinity is high. However, the carbon concentration by SIMS analysis is 1e+16 ($1\times10^{16}$) $cm^{-3}$, which is very high with respect to standard values of less than the lower limit of detection (less than 3e+15 ($3\times10^{15}$) $cm^{-3}$). This is probably because, at the growth temperature of 400° C., source gases are decomposed to grow layers having high crystallinity; however, carbon in hydrocarbons contained in the source gases is incorporated into the layers. Carbon functions as a p-type impurity in InP-based compound semiconductors. High-concentration carbon results in the formation of an unintended p-type region. Accordingly, the performance of semiconductor elements is degraded: for example, dark current is increased in photodiodes. In Comparative example B1 only, the carbon concentration was very high. In the other test samples, the carbon concentration was less than the lower limit of SIMS analysis.

When the growth is performed at a growth temperature of 425° C., both a carbon concentration of 5e+15 ($5\times10^{15}$) $cm^{-3}$ or less and a protruding-surface-defect density of zero are difficult to achieve. In particular, protruding surface defects having a height of 10 μm or more are generated at a density that does not cause a considerable decrease in the yield. From a different point of view, epitaxial wafers according to the present invention can be identified from the presence of such a protruding surface defect.

(4) <Dark Current in Photodiode>

Comparative examples B1 and C2 provided (defective) test samples having a high dark current. The other test samples had a practically allowable low value. In Comparative example C2, the dark current is very high. This is probably because the crystallinity is poor (full width at half maximum: 170 seconds). In Comparative example B1, the very high carbon concentration probably results in the increase in the dark current. The other test samples (Invention examples A1 to A3 and Comparative example C1) were good in terms of dark current.

(5) <Yield of Photodiodes with Respect to InP Substrate>

Since the dark current was high in Comparative examples B1 and C2, the yield was 0%. On the other hand, in Comparative example C1, the density of protruding surface defects was high and hence photodiodes were not obtained (0%). With reference to two screenings of dark current in a photodiode and the density of protruding surface defects in an epitaxial wafer, photodiodes serving as products were produced in Invention examples A1 to A3, aside from the yields. In particular, in view of an increase in the yield of photodiodes, Invention example A1 achieves the highest yield, which indicates that it is important to decrease the density of protruding surface defects.

Example 2

Growth of Window Layer at Temperature Lower than Growth Temperature for the other Epitaxial Layers The epitaxial wafers 1a having a diameter of 2 inches as illustrated in FIG. 1 were produced such that the window layer was grown at a temperature lower than the growth temperature for the other epitaxial layers. These epitaxial wafers were evaluated. The photodiodes 50 as illustrated in FIG. 10 that were produced from the epitaxial wafers were evaluated in terms of dark current. The test samples were as follows.

(Invention example A4) Growth temperature for InP window layer: 450° C., Growth temperature for InGaAs layer and type-II MQW that underlie the InP window layer: 500° C.

Comparative examples were not particularly produced. For comparison of evaluation test results, Invention example A2 in Example 1 is used as a reference.

Invention example A4 above was evaluated in terms of the items (1) to (5) as in Example 1.

For the purpose of comparison, evaluations of Invention example A4 and Invention example A2 are described in Table II.

TABLE II

|  | Invention example A2 | Invention example A4 |
| --- | --- | --- |
| Growth temperature for InP window layer | 500° C. | 450° C. |
| Growth temperature for Sb-containing epitaxial layer and overlying epitaxial layer | 500° C. | 500° C. |
| Number of protruding surface defects having diameter of about 30 μm and height of 10 μm or more on epitaxial wafer having diameter of 2 inches (density in terms of number is described in parentheses) | 10 defects (0.52 defects $cm^{-2}$) | 5 defects (0.26 defects $cm^{-2}$) |
| XRD evaluation of multiple-quantum well in epitaxial wafer (full width at half maximum of peak) | 80 s | 80 s |
| SIMS impurity analysis of InGaAs diffusive-concentration-distribution-adjusting layer in epitaxial wafer | Carbon concentration: less than lower limit of detection (3e+15 $cm^{-3}$) | Carbon concentration: less than lower limit of detection (3e+15 $cm^{-3}$) |
| Dark current characteristic in produced photodiode itself | Excellent | Excellent |
| Yield of produced photodiode arrays | 45% | 70% |

(1) <Density of Protruding Surface Defects Having Height of 10 μm or More on Epitaxial Wafer>

From Table II, the density of the protruding surface defects is reduced in half by making the growth temperature for the InP window layer be 450° C., which is only 50° C. lower than that for the other epitaxial layers. Specifically, the density was reduced in half from 0.52 defects $cm^{-2}$ in the case where the growth temperature was not changed from 500° C., to 0.26 defects $cm^{-2}$.

(2) <XRD Evaluation of MQW>

The full width at half maximum of a peak that gives an index for crystalline disorder was not changed when the growth temperature for the InP window layer only was decreased by 50° C.

(3) <Impurity Concentration Analysis of InGaAs Diffusive-Concentration-Distribution-Adjusting Layer>

The carbon concentration in InGaAs was low and less than the lower limit of detection in both of Invention examples A4 and A2. Thus, no change was observed when the growth temperature for the InP window layer only was decreased by 50° C.

(4) <Dark Current in Photodiode>

Both of Invention examples A4 and A2 were evaluated as Excellent in terms of dark current in photodiodes.

(5) <Yield of Photodiodes with Respect to InP Substrate>

The difference between Invention examples A4 and A2 in yield of photodiodes with respect to an InP substrate clearly results from the density of the protruding surface defects. By making the density of protruding surface defects from 0.52 defects $cm^{-2}$ in Invention example A2 to 0.26 defects $cm^{-2}$ in Invention example A4, the yield greatly increased from 45% to 70%.

The results of Example 2 have clearly demonstrated the advantages provided by decreasing the growth temperature for the InP window layer by at least 25° C. with respect to the growth temperature for the absorption layer (MQW) and the InGaAs layer (diffusive-concentration-distribution-adjusting layer).

Embodiments of the present invention have been described so far. However, embodiments of the present invention disclosed above are given by way of illustration, and the scope of the present invention is not limited to these embodiments. The scope of the present invention is indicated by Claims and embraces all the modifications within the meaning and range of equivalency of the Claims.

INDUSTRIAL APPLICABILITY

According to the present invention, an epitaxial wafer, a photodiode, and the like that contain an antimony-containing layer can be efficiently produced while protruding surface defects causing a considerable decrease in the yield can be reduced and impurity contamination causing degradation of the performance can be suppressed. As a result, photodiodes having responsivity covering the near-infrared long-wavelength region can be produced at low production cost.

The invention claimed is:

1. A method for producing an epitaxial wafer including a substrate composed of a III-V compound semiconductor and an epitaxial layer structure that is composed of a III-V compound semiconductor, includes a diffusive-concentration-distribution-adjusting layer and a window layer, and is disposed on the substrate, the method comprising:
a step of growing an antimony-containing layer on the substrate by metal-organic vapor phase epitaxy using only metal-organic sources; and a step of growing, on the antimony-containing layer, an antimony-free layer including the diffusive-concentration-distribution-adjusting layer and the window layer,
wherein, from the growth of the antimony-containing layer to completion of the growth of the window layer, the growth is performed at a growth temperature of 425° C. or more and 525° C. or less,
wherein the substrate is an InP substrate; an InP window layer is grown as the window layer; and, from initiation of the growth of the antimony-containing layer to completion of the growth of the InP window layer, the growth is continuously performed in the same growth chamber by the metal-organic vapor epitaxy using only metal-organic sources such that an interface formed between the diffusive-concentration-distribution-adjusting layer and the InP window layer has an oxygen concentration and a carbon concentration that are less than $1 \times 10^{17}$ $cm^{-3}$.

2. The method for producing an epitaxial wafer according to claim 1, wherein growth temperature for the window layer is at least 25° C. lower than growth temperature for a layer ranging from the antimony-containing layer to a layer directly under the window layer.

3. The method for producing an epitaxial wafer according to claim 1, wherein the antimony-containing layer is a multilayer constituted by one or both of a pair of layers forming a multiple-quantum well structure (MQW).

4. The method for producing an epitaxial wafer according to claim 1, wherein, in the epitaxial layer structure, a type-II MQW constituted by $In_xGa_{1-x}As$ (0.38≤x≤0.68) and $GaAs_{1-y}Sb_y$ (0.36≤y≤1.00) or a type-II MQW constituted by $Ga_{1-u}In_uN_vAs_{1-v}$ (0.4≤u≤0.8, 0<v≤0.2) and $GaAs_{1-y}Sb_y$ (0.36≤y≤1.00) is grown.

5. A method for producing a photodiode from an epitaxial wafer produced by the production method according to claim 1, the antimony-containing layer serving as entirety of or a part of an absorption layer, the method comprising: a step of forming a selective diffusion mask pattern on the window layer of the epitaxial wafer; and a step of selectively diffusing an impurity from the window layer exposed through an opening of the selective diffusion mask pattern such that the impurity reaches the absorption layer.

6. An epitaxial wafer comprising: a substrate composed of a III-V compound semiconductor; and an epitaxial layer structure that is composed of a III-V compound semiconductor, includes a diffusive-concentration-distribution-adjusting layer and a window layer, and is disposed on the substrate, wherein
the epitaxial layer structure includes an antimony-containing layer and, on the antimony-containing layer, an antimony-free layer including the diffusive-concentration-distribution-adjusting layer and the window layer,
a density of protruding surface defects having a height of 10 μm or more in the window layer is 0.05 defects $cm^{-2}$ or more and 1.25 defects $cm^{-2}$ or less, and the antimony-containing layer and the antimony-free layer have a carbon concentration of $5 \times 10^{15}$ $cm^{-3}$ or less,
wherein the substrate is an InP substrate; the window layer is an InP window layer; and an interface between the diffusive-concentration-distribution-adjusting layer and the InP window layer has an oxygen concentration and a carbon concentration that are less than $1 \times 10^{17}$ $cm^{-3}$.

7. The epitaxial wafer according to claim 6, wherein the antimony-containing layer is a multilayer constituted by one or both of a pair of layers forming a multiple-quantum well structure (MQW).

8. The epitaxial wafer according to claim 6, wherein the antimony-containing layer is a $GaAs_{1-y}Sb_y$ multilayer in a type-II MQW constituted by $In_xGa_{1-x}As$ (0.38≤x≤0.68) and $GaAs_{1-y}Sb_y$ (0.36≤y≤1.00) or a $GaAs_{1-y}Sb_y$ multilayer in a type-II MQW constituted by $Ga_{1-u}In_uN_vAs_{1-v}$ (0.4≤u≤0.8, 0<v≤0.2) and $GaAs_{1-y}Sb_y$ (0.36≤y≤1.00).

9. A photodiode comprising the epitaxial wafer according to claim 6, wherein the antimony-containing layer serves as entirety of or a part of an absorption layer, a selective diffusion mask pattern is disposed on the window layer, and an impurity is distributed from the window layer exposed through an opening of the selective diffusion mask pattern such that the impurity reaches the absorption layer.

10. An optical sensor device comprising the photodiode according to claim 9.

* * * * *